(12) United States Patent
Buhr

(10) Patent No.: US 6,815,982 B2
(45) Date of Patent: Nov. 9, 2004

(54) ELECTRICAL OR ELECTRONIC CIRCUIT ARRANGEMENT AND ASSOCIATED METHOD

(75) Inventor: Wolfgang Buhr, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 151 days.

(21) Appl. No.: 10/324,790

(22) Filed: Dec. 20, 2002

(65) Prior Publication Data

US 2003/0137323 A1 Jul. 24, 2003

(30) Foreign Application Priority Data

Dec. 29, 2001 (DE) .......................................... 101 64 424

(51) Int. Cl.[7] .............................................. H03K 19/00
(52) U.S. Cl. ............................. 326/93; 326/38; 326/101
(58) Field of Search ......................... 326/37, 38, 93–98, 326/101, 102; 716/1, 6, 8

(56) References Cited

U.S. PATENT DOCUMENTS

| | | | | |
|---|---|---|---|---|
| 5,638,291 A | * | 6/1997 | Li et al. ........................ | 716/18 |
| 6,092,211 A | * | 7/2000 | Hozumi ....................... | 713/500 |
| 6,260,175 B1 | * | 7/2001 | Basel ............................. | 716/1 |
| 6,564,353 B2 | * | 5/2003 | Sano ............................. | 716/2 |
| 6,593,792 B2 | * | 7/2003 | Fujii ........................... | 327/276 |
| 6,737,926 B2 | * | 5/2004 | Forbes ......................... | 331/57 |

* cited by examiner

Primary Examiner—Don Le
(74) Attorney, Agent, or Firm—Peter Zawilski

(57) ABSTRACT

To refine both an electrical or electronic circuit arrangement whose physical layout (100) comprises conductors (10) and cells (30, 40) associated with the conductors (10), such as flip-flop cells, buffer cells, inverter cells, logic gate cells or the like, and a method of generating at least one clock tree for the physical layout (100) of an electrical or electronic circuit arrangement, and to refine them in such a way that, when the clock tree is being adjusted, there is no need for the topology of any of the other cells outside the clock tree to be altered, it is proposed that the cells (30, 40) intended for the adjustment of the clock tree in the layout (100) be of a substantially uniform topological extent or size.

10 Claims, 1 Drawing Sheet

ELECTRICAL OR ELECTRONIC CIRCUIT ARRANGEMENT AND ASSOCIATED METHOD

THE FIELD OF THE INVENTION

The present invention relates in general to the technical field of digital circuits and the design of their physical layout.

In particular, the present invention relates to an electrical or electronic circuit arrangement whose physical layout comprises conductors and cells associated with the conductors, such as flip-flop cells, buffer cells, inverter cells, logic gate cells and the like.

The present invention further relates to a method of producing at least one clock tree for the physical layout of an electrical or electronic circuit arrangement.

THE BACKGROUND ART

When electrical or electronic systems, and particularly electrical or electronic circuit arrangements, are being designed, there are certain steps in the procedure that are gone through repeatedly in a preset sequence; this is true both of microelectronic systems and also, in principle, of printed-circuit boards. Once the circuit or parts thereof have been designed with the help of a description in H[ardware] D[escription] L[anguage] or a graphic editor, this is normally followed by a first simulation to allow the functional behavior and, in the case of a bottom-up procedure, the behavior with time as well even at this early stage, to be verified.

If faults are found, the design is revised and tested again. Because the first simulation generally takes place before the physical layout is produced, it is also referred to as the pre-layout simulation. The parasitic capacitances and parasitic resistances on the connecting conductors that are to be laid down later are estimated in advance and the first simulation is carried out with these estimated values. In the present connection, the term "parasitics" will be borrowed from the specialist vocabulary accepted in the field of C[omputer] A[ided] E[engineering] and will be used to refer generally to such parasitic capacitances and resistances.

In the pre-layout simulation, many programs allow only for the already known number of inputs to other gates that are connected to a gate output or always cater for the maximum permitted capacitive load at a gate output, e.g. a capacitive load of 2 pF for a standard cell. In the first case the results tend to be optimistic and in the second pessimistic.

Once the physical layout of the microelectronic circuit or printed-circuit board has been prepared and has successfully passed the D[esign] R[ule] C[hecks] (DRC) or E[lectronic] R[ules] C[hecks] (ERC), the parasitics that will actually occur on the connecting conductors can be determined from it. So-called extraction programs for the netlists calculate the data that is wanted from the conductor geometries.

For chip design these programs are particularly complicated because the parasitic effects in the semiconductor structures themselves, such as source-drain capacitances and resistances, gate capacitances, contact resistances and the like, are extracted as well. Because the contours of the connection layers or implant regions in microelectronic circuits are very small in relation to their thickness, the parasitics are calculated separately by area and by the size of the structures and the individual results are added together.

As well as the task of extracting the parasitics from the finished physical layout, there is also an important verification task that the extraction programs for the netlists are called upon to perform. When standard cells are being designed at the level of the physical layout, it is very easy for errors to creep in, and for this reason it is important for there to be a possible way of extracting the netlist from the physical design.

In the technical field referred to above, something else that is widely familiar (and necessary) for the design of standard cells at the level of the physical layout is for the so-called clock tree to be adjusted to meet topological requirements in the physical layout of the circuit arrangement.

An adjustment process of this kind conventionally involves the replacement or insertion, or the deletion, of buffer cells and inverter cells of different sizes within the clock tree. This adjustment process also changes the topology of other cells that do not form part of the clock tree proper, because the area occupied by the cells that do form part of the clock tree changes as a result of the replacement or insertion, or deletion, of the buffer cells or inverter cells.

The changes described above affect the overall layout of the circuit arrangement to such a degree that there may again be a significant change in the behavior of signals with time in the logic that was freely laid out, which means that fresh corrections are needed to the signal paths concerned. In other words, what this means is that the adjustment of the clock tree necessarily entails behavior with time being re-verified for the entire design of the circuit arrangement.

The standard size of clock buffer cells and clock inverter cells has necessarily to be oriented to the maximum cell size needed, to give the clock-tree adjusting tool the freedom of maneuver it needs for optimization purposes. This results in an overall increase in the area occupied by the cells that form part of the clock tree.

SUMMARY OF THE INVENTION

Taking the disadvantages and inadequacies described above as a point of departure and with due consideration of the prior art outlined above, it is an object of the present invention to refine an electrical or electronic circuit arrangement of the above kind, and a method of generating at least one clock tree for the physical layout of an electrical or electronic circuit arrangement, in such a way that there is no need for the topology of any of the other cells outside the clock tree to be changed when the clock tree is being adjusted.

This object is achieved by an electrical or electronic circuit arrangement having the features specified in claim 1 and by a method having the features specified in claim 6. Advantageous embodiments and useful refinements of the invention are detailed in the respective sets of subclaims.

Hence the present invention is based on the fact that, when the so-called clock tree, i.e. the branching tree by which clock signals are distributed to cells such as flip-flop cells or logic gate cells, is being generated for digital circuit arrangements, automatic data-processing means, and particularly automatic software means, operate on the netlist for the circuit arrangement. To adjust the individual clock-signal delays and to safeguard the timing as a whole, these software means alter both the delay applied by individual buffer cells and inverter cells situated on the clock signal path and also the driver power.

This concept includes the preferably exclusive use of special trimmable clock buffer cells or special trimmable clock inverter cells within a clock tree. This being the case, these clock buffer cells or clock inverter cells, which are preferably arranged to form so-called library cells, differ from one another, in a particularly advantageous embodiment, in respect of the delay applied to the signal and in respect of the driver power, in order to make it possible for the clock tree to be adjusted.

However, in accordance with the teaching of the present invention, all these clock buffer cells and/or clock inverter cells are preferably of a uniform extent, i.e. of a fixed standard size, to prevent the adjustment of the clock tree, i.e. the branching tree for the distribution of a clock signal, from affecting the topological arrangement of other cells in the layout.

Consequently, the process of adjusting the clock tree is neutral with respect to placement, i.e. topologically neutral adjustment of the clock tree is possible in accordance with the invention by means of the trimmable buffer (library) cells of fixed standard size and by means of the trimmable inverter (library) cells of fixed standard size. The clock buffer cells and clock inverter cells used have to be made available in this case in the so-called cell library in addition to the other buffer cells and inverter cells.

If the present invention is to be refined in a particularly advantageous manner, the clock buffer cells or clock inverter cells may be formed by a group of cells, which cells differ from one another in respect of their delay parameters and/or their driver powers either individually or in groups.

As an alternative or addition to the above, the clock buffer cells or clock inverter cells may each be parametrizable buffer cells or inverter cells, whose parameter settings are assigned to them after the adjustment of the clock tree; in this connection, it should be exclusively clock buffer cells and clock inverter cells of this kind that are used within the clock tree of a network, to enable the whole clock tree to be adjusted.

In a particularly inventive refinement of the present circuit arrangement and of the method associated with this circuit arrangement, at least the final run for optimizing the timing delays on the signal path and the driver power that forms part of the processing of a physical layout may, at the same time, be a clock-tree adjusting run.

When the proposed clock buffer cells and clock inverter cells are used, the clock tree can be finally optimized by this adjusting run, in which case there is, in a manner essential to the invention, no further change to the already optimized topology of any of the other cells outside the clock tree.

This results—as also do the technical measures described above—in a greater degree of reliability and predictability for the results of the adjustment and keeps the effects that the two optimizing steps have on the layout separate from one another.

The present invention finally relates to the use of at least one parametrizable cell, and in particular at least one parametrizable buffer cell and/or at least one parametrizable inverter cell, which cells are intended for the adjustment of at least one clock tree in the physical layout of an electrical or electronic circuit arrangement, for the implementation of classes of cell, such as flip-flop cells, buffer cells, inverter cells, logic gate cells and the like, that are associated with the conductors of the circuit arrangements and are of different maximum sizes.

In other words, what this means is that, when using parametrizable clock tree cells, cell classes of different maximum sizes can, by a procedure essential to the invention, be introduced, so that it is possible for a limit to be set only to the maximum area as a function of the overall size of the clock tree.

BRIEF DESCRIPTION OF THE DRAWINGS

These and other aspects of the invention are apparent from and will be elucidated with reference to the embodiments described hereinafter.

In the drawings.

The same or similar arrangements, items or features are given the same reference numerals in FIGS. 1 to 3.

DETAILED DESCRIPTION

Figure 1:
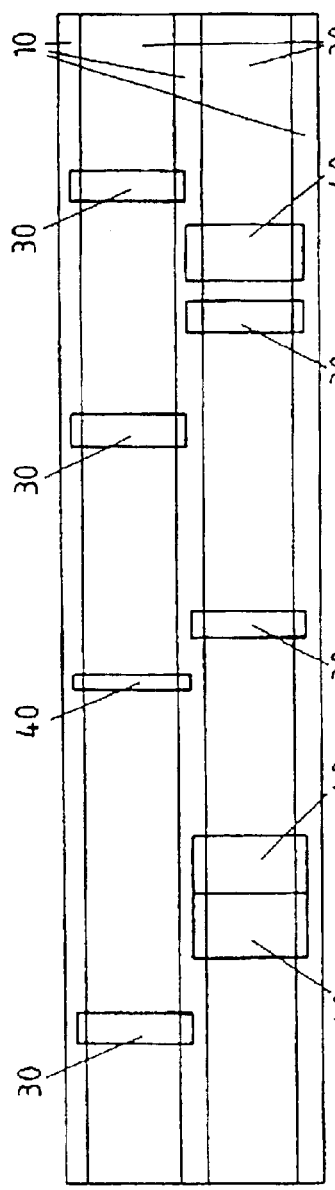
FIG. 1 is an enlarged diagrammatic detail of the layout of an electronic circuit arrangement as known from the prior art, before all the cells have been placed, this detail not necessarily being to scale in order to allow the individual arrangements, items or features to be neatly presented and clearly discerned.

Shown in FIG. 1 is a detail of a conventional layout 100 for a smart-card controller.

In this physical layout 100, conductors 10 that are orientated horizontal with FIG. 1 run to the power supply; between each pair of these horizontal conductors 10 are arranged rows 20 of library cells, such as flip-flops, inverters, buffers, logic gates and the like, that are placed automatically, i.e. by means of a placing program.

Among the multitude of cells arranged in the rows 20, there are also so-called filler cells 30. These filler cells 30 are purely capacitive cells that are inserted by the program for generating the clock tree at more or less regular intervals and that act as a supporting capacitance for the logic matrix as a whole.

Also arranged in the rows 20 are so-called clock tree elements 40. These clock tree elements 40 are buffer cells and inverter cells of different driver capabilities that the program for generating the clock tree, i.e. the branching tree for distributing a clock signal, uses to generate the clock tree.

As can also be seen from FIG. 1, the program for generating the clock tree tries to adjust the clock signals for all the blocks timed by a clock tree within preset tolerances in respect of the timing of the clock signal edges and of the driver power by using buffer cells 40 or inverter cells 40 of different sizes.

Figure 2:
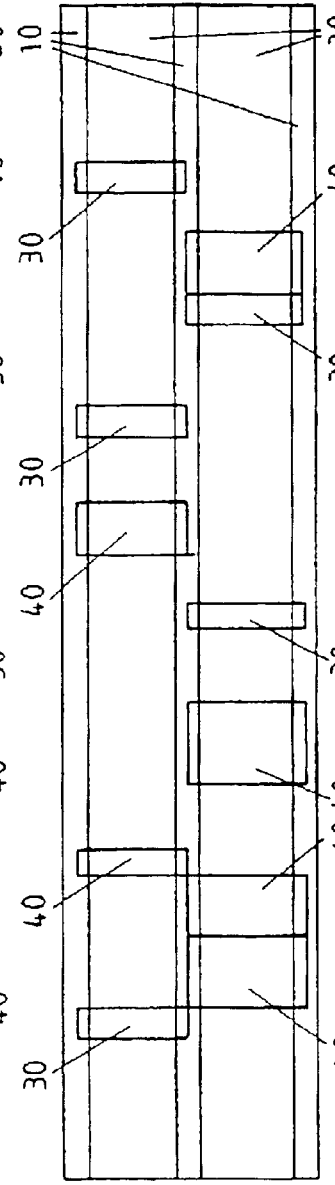
FIG. 2 shows the same detail as in FIG. 1 after all the cells have been placed.

The diagram in FIG. 2 shows the detail of the layout 100 after all the cells have been placed. It is clear from the detail shown in FIG. 2 that the adjustment of the clock tree after all the cells had been placed, which naturally led to certain clock tree cells 40 being replaced, also changed the placement of adjoining cells. However, since it is only by the routing of the clock signals that it is possible to arrive at a final and definitive adjustment for the clock tree, this step necessarily has to take place at a later point in time in the course of the chip layout.

Figure 3:
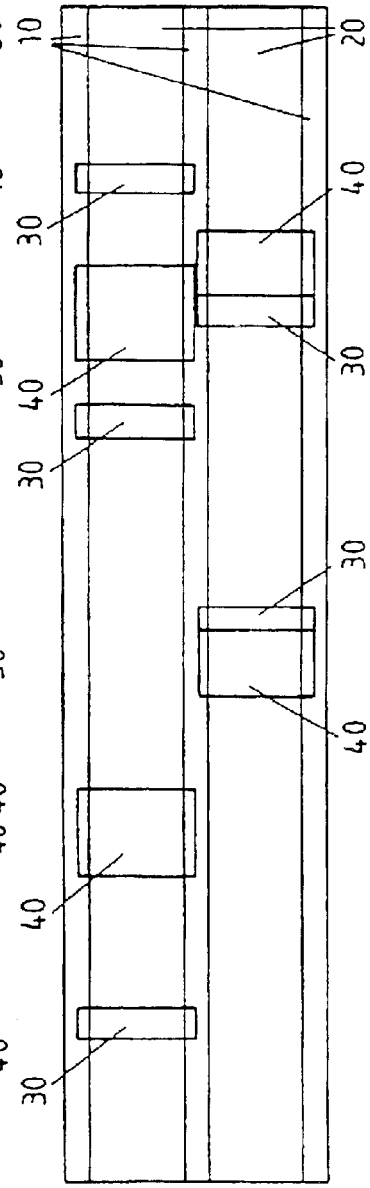
FIG. 3 is an enlarged diagrammatic detail of the layout of an electronic circuit arrangement according to the present invention, this detail not necessarily being to scale in order to allow the individual arrangements, items or features to be neatly presented and clearly discerned.

It is for the above reasons that the use of trimmable clock tree cells 40 of a uniform standard size as provided for in accordance with the invention and as seen in the upper of the two rows in FIG. 3 is found to be a useful step.

As shown in the lower of the two rows in FIG. 3, it is possible, in place of or in addition to the cells 40 of a uniform standard size, for each smaller buffer cell and/or each smaller inverter cell on the clock tree to have added to it a corresponding filler cell 30, thus always producing for the two cells together (=filler cell 30+clock tree cell 40 or clock tree cell 40+filler cell 30) a uniform extent which is that of the largest possible clock tree cell.

In this connection, it can be seen from the lower of the two rows in FIG. 3 that the two cells 30+40 or 40+30 are always placed in pairs. In this way too, in accordance with the invention, constant placing for the rest of the cells before and after the adjustment of the clock tree is ensured.

To sum up, it can be said that in view of the teaching according to the invention, special clock buffer cells and/or special clock inverter cells are introduced into the cell libraries. It is true that these clock buffer cells and clock inverter cells have different driver/timing parameters, but they do have one standard extent or area.

Even the introduction of a plurality of classes of clock cell having different maximum values and corresponding different standard extents or areas may be an advantage; it would however then be necessary for exclusively these buffer cells and/or these inverter cells to be used in the clock tree in a design.

List of Reference Numerals

100 Physical layout of an electrical or electronic circuit arrangement
10 Conductor, particularly for supplying voltage
20 Row for library cells
30 Filler cell
40 Clock tree element and particularly a buffer cell or inverter cell.

What is claimed is:

1. An electrical or electronic circuit arrangement whose physical layout (100) comprises conductors (10) and cells (30, 40) associated with the conductors (10) such as flip-flop cells, buffer cells, inverter cells logic gate cells and the like, characterized in that the cells (30, 40) intended for adjusting at least one clock tree in the layout (100) are of substantially uniform topological extent or size.

2. A circuit arrangement as claimed in claim 1, characterized in that at least some of the cells, and in particular at least some of the cells (40) intended for adjusting the clock tree, are in the form of library cells.

3. A circuit arrangement as claimed in claim 1 or 2, characterized in that the cell (40) intended for adjusting the clock tree is in the form of a parametrizable buffer cell and/or an additional clock buffer cell and/or a parametrizable inverter cell and/or an additional clock inverter cell.

4. A circuit arrangement as claimed in claim 3, characterized in that the parametrizable buffer cell and/or the parametrizable inverter cell has the given parameter settings assigned to it after the clock tree has been adjusted.

5. A circuit arrangement as claimed in claim 3, characterized in that the additional clock buffer cells and/or the additional clock inverter cells are arranged to differ individually or in groups in respect of the given at least one delay parameter assigned to the clock signal and/or in respect of the given driver power or capabilities.

6. Use of at least one parametrizable cell (40), and in particular at least one parametrizable buffer cell and/or at least one parametrizable inverter cell, particularly as claimed in claim 3 or 4, which cell is intended for the adjustment of at least one clock tree in the physical layout (100) of an electrical or electronic circuit arrangement, for the implementation of classes of cells, such as flip-flop cells, buffer cells, inverter cells, logic gate cells and the like, that are associated with the conductors (10) of the circuit arrangement and are of different maximum sizes.

7. A method of generating at least one clock tree for the physical layout (100) of an electrical or electronic circuit arrangement particularly as claimed in at least one of claims 1 to 5, characterized in that the clock tree is adjusted by means of cells (30, 40) intended for this purpose of substantially uniform topological extent or size.

8. A method as claimed in claim 7, characterized in that, to adjust the clock tree, at least one buffer cell and/or at least one inverter cell is parametrized and/or at least one additional clock buffer cell and/or at least one additional clock inverter cell is inserted in the layout (100).

9. A method as claimed in claim 7 or 8, characterized in that the parametrizable buffer cell and/or the parametrizable inverter cell has the particular parameter settings assigned to it after the clock tree has been adjusted.

10. A method as claimed in any one of claims 7 to 9, characterized in that at least the final run that is made to optimize the time delays on the signal path and/or the driver power or capabilities is, at the same time, a run to adjust the clock-tree of the layout (100).

* * * * *